(12) United States Patent
Hayama et al.

(10) Patent No.: US 6,440,822 B1
(45) Date of Patent: Aug. 27, 2002

(54) METHOD OF MANUFACTURING SEMICONDUCTOR DEVICE WITH SIDEWALL METAL LAYERS

(75) Inventors: Nobuyuki Hayama; Masaaki Kuzuhara; Kouji Matsunaga; Tatsuo Nakayama; Yuji Takahashi; Yasuo Ohno; Kazuaki Kunihiro; Kensuke Kasahara; Hironobu Miyamoto; Yuji Ando, all of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/901,424

(22) Filed: Jul. 9, 2001

(30) Foreign Application Priority Data

Jul. 10, 2000 (JP) ........................................ 2000-208925

(51) Int. Cl.[7] ............................................ H01L 21/301
(52) U.S. Cl. ........................ 438/462; 438/113; 438/114; 438/122; 438/460
(58) Field of Search ............................... 438/113, 114, 438/122, 118, 460, 462

(56) References Cited

U.S. PATENT DOCUMENTS

| 5,275,958 | A | * | 1/1994 | Ishikawa | ............ 148/DIG. 135 |
|---|---|---|---|---|---|
| 5,434,094 | A | * | 7/1995 | Kobiki et al. | ......... 148/DIG. 28 |
| 5,872,396 | A | * | 2/1999 | Kosaki | ........................ 257/620 |
| 6,157,077 | A | * | 12/2000 | Matsuoka et al. | ........... 257/706 |
| 6,221,751 | B1 | * | 4/2001 | Chen et al. | ................... 438/110 |
| 6,245,596 | B1 | * | 6/2001 | Kosaki et al. | .............. 438/113 |
| 6,306,731 | B1 | * | 10/2001 | Igarashi et al. | ............. 438/113 |

FOREIGN PATENT DOCUMENTS

| JP | 63-276276 | 11/1988 | ............ H01L/29/80 |
|---|---|---|---|
| JP | 3-58534 | 9/1991 | ......... H01L/21/338 |
| JP | 6-5880 | 1/1994 | ......... H01L/29/804 |
| JP | 6-338522 | 12/1994 | ......... H01L/21/338 |
| JP | 7/5832 | 1/1995 | ............. G09G/1/00 |
| JP | 7-66384 | 3/1995 | ............ H01L/29/41 |
| JP | 11-126923 | 5/1999 | ............ H01L/33/00 |

* cited by examiner

*Primary Examiner*—Trung Dang
(74) *Attorney, Agent, or Firm*—Hayes Soloway P.C.

(57) ABSTRACT

In a method of manufacturing a semiconductor device, trench sections are formed on a side of one of opposing surface portions of a substrate. At lest a part of each of the trench sections is covered by a power supply metal layer which is formed on the one surface portion of the substrate. The substrate is fixed to a support such that the one surface of the substrate fits to the support. A chip is separated from the substrate using the trench sections. A conductive film is formed on side surface portions of the chip and the other surface portion of the chip. Then, the chip is separated from the support.

15 Claims, 5 Drawing Sheets

METHOD OF MANUFACTURING SEMICONDUCTOR DEVICE WITH SIDEWALL METAL LAYERS

BACKGROUND OF THE INVENTION

1. Field of the Invention

The present invention relates to a method of manufacturing a semiconductor device that has side wall metal layers.

2. Description of the Related Art

Most semiconductor devices used for mobile-communication and satellite-communication are available in the form of high-speed, high-performance small MMICs. The MMIC is composed of active elements such as field effect transistors and bipolar transistors and passive elements such as capacitors and inductors. In such an MMIC, radiation of heat generated from elements and connection to the ground potential are important for the high circuit performance. In the MMIC using a GaAs semiconductor substrate, a metal ground layer is formed on the back surface of the substrate and the elements are formed on the front surface of the substrate.

As disclosed in Japanese Laid Open Patent Application (JP-A-Heisei 7-5832), a surface pattern is connected to a metal ground layer by side wall metal layers provided on the side walls of a chip or via-holes formed to penetrate the substrate. The metal ground layer functions as a so-called "plated heat sink" (hereinafter, to be referred to as "PHSf" to radiate heat generated by the active elements. The via-holes and device-separating trenches can be easily formed in the MMIC using such a GaAs substrate by means of reactive ion etching using a sulfuric acid-based etchant or chlorine-based etchant.

In recent years, researches and development have been conducted to provide electronic devices or light-emitting devices that use nitride-based III–V group compound semiconductor (GaN-based semiconductor) composed mainly of GaN. The GaN-based semiconductor are superior to the conventional GaAs-based field effect transistors in saturation electron mobility and a break-down voltage, and the GaN-based semiconductor would be effective for a high frequency field effect transistor and a high power field effect transistor. Such GaN-based semiconductor is usually grown on a sapphire substrate or a SiC substrate by means of chemical vapor deposition (CVD) or molecular beam epitaxy (MBE).

Conventionally, trenches are formed by a scriber or a dicing saw in the surface of the substrate which is a chemically stable substrate such as a sapphire substrate or a SiC substrate, and the substrate is broken using the trenches, as disclosed in Japanese Laid Open Patent Application (JP-A-Heisei 11-126923). By this method, the sapphire substrate can be separated into chips, but it is difficult to form metal layers on side walls of the chip.

It may be possible to form a metal ground layer on the surface of the substrate and to carry out mechanical dicing from the back of the substrate such that the metal ground layer is exposed. In this case, however, side walls of the metal ground layer are exposed only. For this reason, there would be a case that the power cannot be stably supplied from the metal ground layer due to dirt or scars in a metal plating process. In such a case, side wall metal layers would fail to have a uniform thickness or a desired shape. As a result, the MMIC cannot provide desired characteristics, and the product yield of the MMIC would be inevitably low.

In conjunction with the above description, a method of manufacturing a semiconductor device is disclosed in Japanese Laid Open Patent Application (JP-A-Showa 63-276276). In this reference, a semiconductor substrate is adhered to a support plate. The semiconductor substrate has a source electrode, a drain electrode and a gate electrode through an insulating film in a front surface and an electrode layer at a back surface. The insulating film in a scribe region of the semiconductor substrate is selectively removed and then the semiconductor substrate is selectively etched using the remained insulting film as a mask so that the electrode layer is exposed. A metal layer is formed to connect the source electrode and the electrode layer and the semiconductor substrate is separated.

Also, a microwave monolithic integrated circuit is disclosed in Japanese Laid Open Patent Application (JP-A-Heisei 3-58534). In this reference, a plurality of microwave monolithic integrated circuits are formed on a main surface of a semi-insulative compound substrate. Via-holes are formed between the adjacent integrated circuits to penetrate the substrate. A ground conductor of the integrated circuit is led to a back surface of the substrate through the via-hole. The substrate is separated into the integrated circuits by breaking the semiconductor along the via-holes.

Also, a method of manufacturing a semiconductor device is disclosed in Japanese Laid Open Patent Application (JP-A-Heisei 6-5880). In this reference, a high frequency, large output FET, a gate electrode (2), a source electrode (3), and a drain electrode (4) are formed on the main surface of a semi-insulative GaAs substrate (1) and covered by an insulating film (5). After the main surface of the semi-insulative GaAs substrate (1) is fixed to a support plate 12 by using wax (13), the substrate is made thin at the back side to have the thickness of several tens of micrometers. Next, a protection film (14) is deposited on the back surface of the thinned substrate. Via-holes (7) are formed using as a mask a protection film pattern (14a) which has been aligned with the source electrode. The protection film pattern is removed and a metal layer (8) is formed on the entire back surface of the substrate and then a heat radiation electrode (9) is formed by a gold (Au) plating method.

Also, a method of manufacturing a compound semiconductor device is disclosed in Japanese Laid Open Patent Application (JP-A-Heisei 6-338522). In this reference, a plurality of circuit elements are formed on a main surface of a semi-insulative substrate. The main surface of the substrate is etched so as to form grooves for separating the substrate into chips. The substrate is adhered to a support plate at the side of main surface. The back surface side of the substrate is grinded until the grooves are exposed. A metal layer is deposited on the entire back surface of the substrate so as to allow the chips to be held. The substrate is peeled from the support plate and the metal layer is cut to dice the substrate into the chips.

Also, a method of manufacturing a semiconductor device is disclosed in Japanese Laid Open Patent Application (JP-A-Heisei 7-66384). In this reference, an active element is formed on the main surface of a semiconductor substrate. A via-hole opening mask for a ground electrode of the active element and a heat radiation hole opening mask in a region directly below the active element are on the back surface of the substrate such that the via-hole opening mask is larger than the heat radiation hole opening mask in size. The back surface of the substrate is etched using the via-hole opening mask and the heat radiation hole opening mask until the ground electrode of the active element is exposed. At this time, a heat radiation hole does not penetrate the substrate. A metal layer is formed on the back surface of the substrate.

SUMMARY OF THE INVENTION

Therefore, an object of the present invention is to provide means for forming side wall metal layers on a semiconductor element made from a substrate that can hardly be processed by chemical reactions, thereby to improve the characteristics of an MMIC and raise the yield thereof.

In an aspect of the present invention, a method of manufacturing a semiconductor device is attained by (a) forming trench sections on a side of one of opposing surface portions of a substrate, wherein at lest a part of each of the trench sections is covered by a power supply metal layer which is formed on the one surface portion of the substrate; by (b) fixing the substrate to a support such that the one surface of the substrate fits to the support; by (c) separating a chip from the substrate using the trench sections; by (d) forming a conductive film on side surface portions of the chip and the other surface portion of the chip; and by (e) separating the chip from the support.

Here, the (a) forming step may include cutting the surface portion of the substrate to form the trench sections. In this case, the (c) separating step may be attained by cutting the substrate from the other surface portion of the substrate to the trench section. Alternatively, the (c) separating step may be attained by grinding the other surface portion of the substrate; and by cutting the grinded substrate from the other surface portion to the trench section.

Also, the (a) forming step may be attained by cutting the one surface portion of the substrate to form first trench portions; by forming the power supply metal layer to cover the one surface portion of the substrate and a surface of each of the first trench portions; and by cutting the first trench portions to form second trench sections so that the trench sections are formed. In this case, the (c) separating step may be attained by grinding the other surface portion of the substrate such that the second trench portions are exposed.

Also, the (a) forming step may be attained by forming a peripheral film in a peripheral portion of the chip on the one surface portion of the substrate to form the trench sections. In this case, the (c) separating step may be attained by cutting the substrate from the other surface portion of the substrate to the trench sections. Alternatively, the (c) separating step may be attained by grinding the other surface portion of the substrate; and by cutting the grinded substrate from the other surface portion of the substrate to the trench section., Also, the (a) forming step may be attained by forming a peripheral film in a peripheral portion of the chip on the one surface portion of the substrate to form first trench portions; by forming the power supply metal layer to cover the one surface portion of the substrate and a surface of each of the first trench portions; and by cutting the first trench portions to form second trench sections so that the trench sections are formed. In this case, the (c) separating step may be attained by grinding the other surface portion of the substrate such that the second trench portions are exposed.

Also, the (b) fixing step may further include filling a material soluble to a solvent in the trench section.

Also, when the conductive film includes a first conductive film and a second conductive film, the (d) forming step may be attained by (f) forming the first conductive film on side surface portions of the chip and the other surface portion of the chip; and by (g) forming the second conductive film on the first conductive film. In this case, the first conductive film may be formed by a sputtering method or a vapor deposition method, and the second conductive film may be formed by a plating method.

DESCRIPTION OF THE PREFERRED EMBODIMENT

Figure 1A:
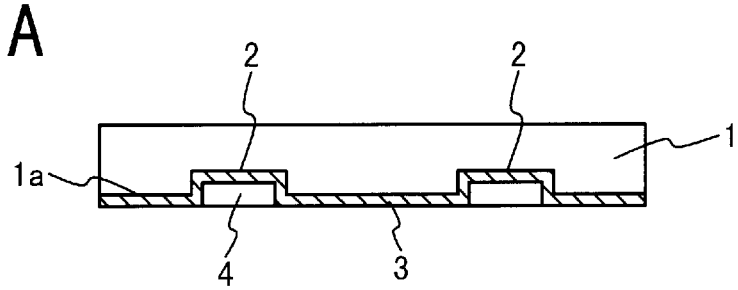
FIGS. 1A to 1F are cross-sectional views showing a method of manufacturing a semiconductor device, according to a first embodiment of the present invention.

Hereinafter, a method of manufacturing a semiconductor device of the present invention will be described with reference to the attached drawings. Nonetheless, the present invention is not limited to the embodiments described below.

FIGS. 1A to 1F are cross-sectional views showing a semiconductor device in a manufacturing according to the first embodiment of the present invention. Referring to FIGS. 1A to 1F, the components identical or similar are designated at the same reference numerals. Once described in detail, each component will not be described again or will be described briefly.

As shown in FIG. 1A, a substrate 1 made of sapphire is prepared. Components such as field effect transistors (not shown), transmission lines (not shown) and capacitors (not shown) are formed on the substrate 1. Device separating trenches 2 are made in the first main surface 1a of the substrate 1 by use of a mechanical apparatus such as a dicing saw. The trenches 2 have a depth of about 20 to 150μm and a width of about 100 to 400 μm.

Next, a metal layer 3 is formed on the region including the trenches 2 by use of a known film-forming method such as sputtering or vapor deposition. The metal layer 3 is made of electrically conductive metal such as Platinum (Pt) or gold (Au) and used for supplying power in a metal plating process. Then, a photoresist layer 4 soluble to organic solvents is applied to cover the metal layer 3 in the trenches 2 so that the substrate surface becomes flat.

Figure 1B:
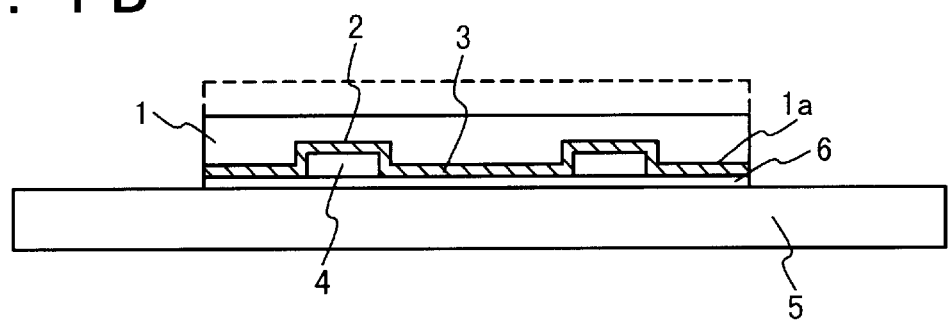

Next, as shown in FIG. 1B, the substrate 1 is bonded or fixed to a support 5 such as a quartz substrate, a sapphire substrate or an Si substrate by use of wax 6 such that the first main surface 1a is contact the support 5. Subsequently, the substrate 1 is subjected to a mechanical polishing process to polish or grind the second main surface of the substrate 1b, until the substrate becomes thin to the extent shown by the broken line in FIG. 1B, but not exposing the trenches 2.

Figure 1C:
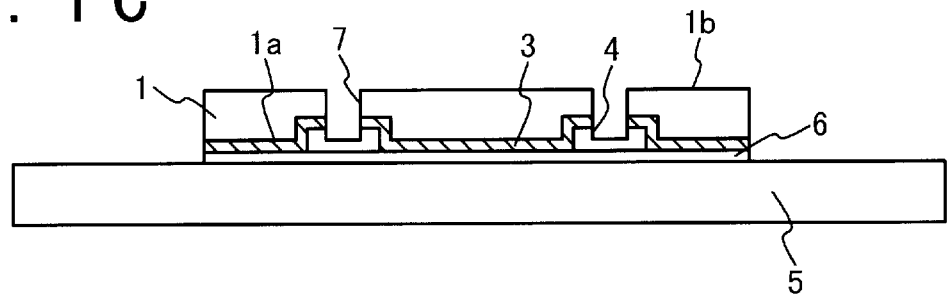

Next, as shown in FIG. 1C, trenches 7 are cut by a dicing saw from the second main surface 1b of the thinned substrate 1. The trenches 7 thus cut reach the trenches 2 at least. The trenches 7 may be deep to reach the photoresist 4 as shown in FIG. 1C.

Figure 1D:
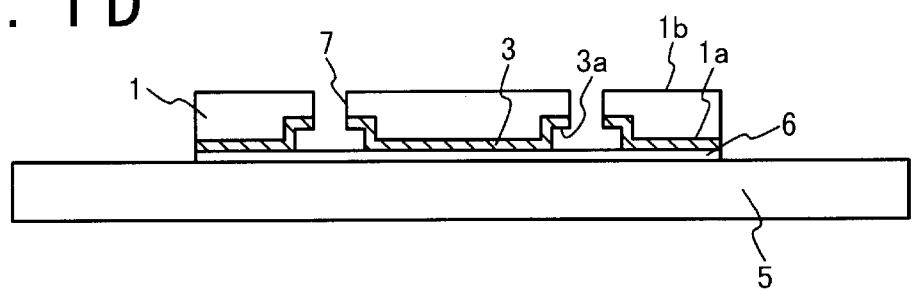

Thereafter, as shown in FIG. 1D, the photoresist 4 exposed in the process of forming the trenches 7 is washed away with an organic solvent. In this way, the surface 3a of the metal layer 3 in each trench 2 is exposed.

Figure 1E:
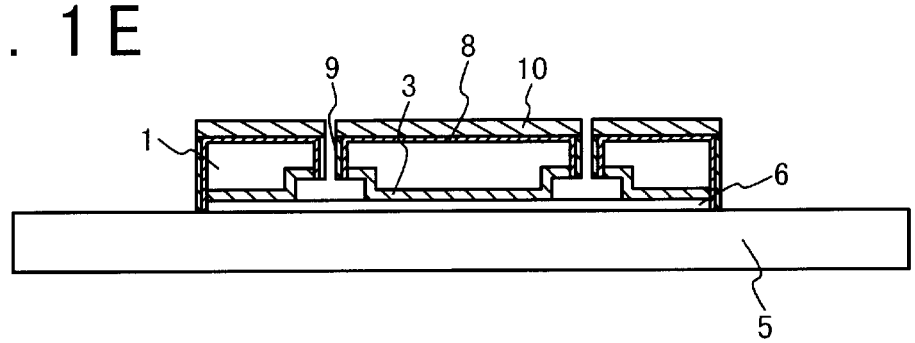

Next, as shown in FIG. 1E, a lower metal layer 8 is formed on the second main surface 1b of the substrate 1 to cover the surfaces of the trenches 7. The lower metal layer 8 is made of an electrically conductive metal such as Platinum (Pt) or gold (Au). As a result, the metal layer 8 is formed such that the metal layer 8 extends from the second main surface 1b of the substrate 1 to the exposed surface 3a of the metal layer 3.

The lower metal layer 8 can be formed by a film-forming method such as a sputtering method or a vapor deposition method. If the sputtering method is employed, the sputtered particles will easily reach the interior of each trench 2 formed in the first main surface 1a of the substrate 1. This facilitates the forming of a metal film that continuously extends from the lower metal layer 8 provided on the second main surface of the substrate 1 to the exposed surface 3a of the metal 3.

Then, a gold film of 20 μm to 50 μm in thick is plated to reach the metal 3 by using the lower metal 8. Thus, the side wall metals 9 and a PHS or ground 10 are formed.

Figure 1F:
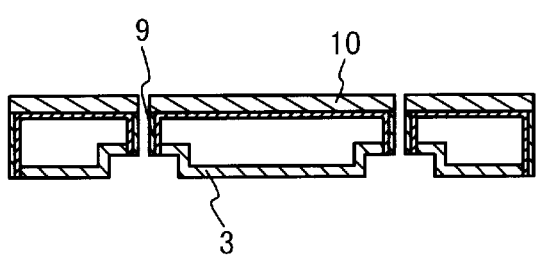

Finally, as shown in FIG. 1F, the wax 6 is solved, and the support 5 is removed. Thus, a chip, i.e., a semiconductor device having side wall metal layers and the PHS is manufactured.

It should be noted that the grinding process is carried out but it is not always necessary.

In the first embodiment described above, the trenches 2 are formed in the first main surface 1a of the substrate 1, and the trenches 7 in the second main surface of the substrate 101. Alternatively, a second trench may be formed in the substrate to extend from the trench formed in the first main surface 1a of the substrate 1.

A method of manufacturing a semiconductor device using the alternative method of forming trenches according to the second embodiment of the invention will be described with reference to FIGS. 2A to 2E. In FIGS. 2A to 2E, the components identical or similar are designated at the same reference numerals. Once described in detail, each component will not be described again or will be described briefly.

FIGS. 2A to 2E are cross-sectional views showing the semiconductor device in the manufacturing method in the second embodiment of the present invention.

Figure 2A:
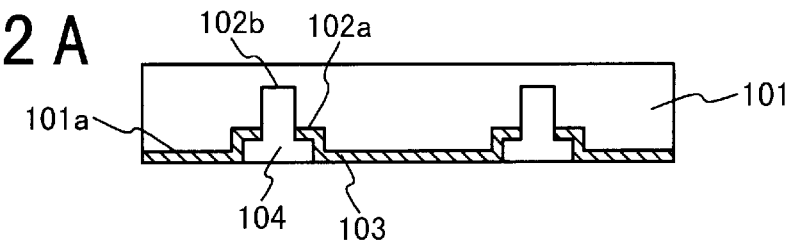
FIGS. 2A to 2E are c cross-sectional views showing a method of manufacturing a semiconductor device, according to a second embodiment of the present invention.

As shown in FIG. 2A, a substrate 101 made of sapphire is prepared. The components such as field effect transistors (not shown), transmission lines (not shown) and capacitors (not shown) are formed on the first main surface 110a of the substrate 101. First device-separating trenches 102a are formed in the first main surface 110a of the substrate 101 by use of a mechanical device such as a dicing saw. The first trenches 102a have a depth of about 20 to 150 μm and a width of about 100 to 400 μm.

Subsequently, a metal 103 is formed on at least the region including the trenches 102a by use of a known film-forming method such as a sputtering method or a vapor deposition method. The metal 103 is made of an electrically conductive metal such as Platinum (Pt) and gold (Au) and used to supply the power in the plating process. Subsequently, second device-separating trenches 102b are cut in the substrate 101, to extend from the first trenches 102a to the inside of the substrate 101. Then, a photoresist 104 soluble to organic solvents is applied to fill the first trenches 102a and the second trenches 102b.

Figure 2B:
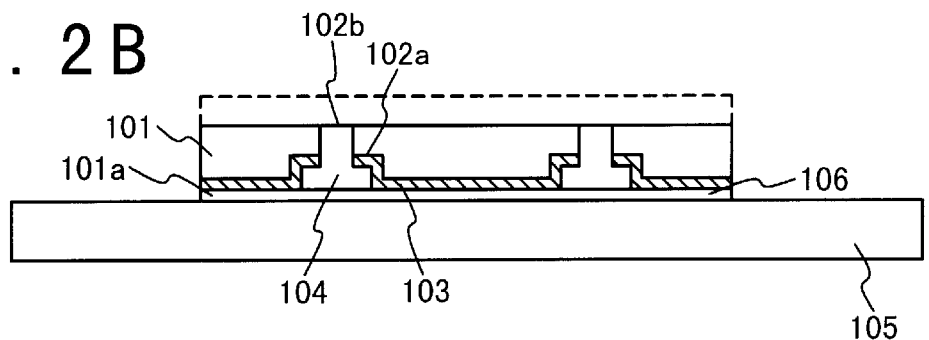

Next, as shown in FIG. 2B, the substrate 101 is bonded or fixed to a support 105 such as a quartz substrate, a sapphire substrate or an Si substrate at the first main surface 110a by use of wax 106. Subsequently, the substrate 101 is subjected to a mechanical polishing process to polish or grind the second main surface 101a of the substrate 101, until the substrate 101 becomes thin to the extent shown by the broken line FIG. 2B. Thus, the second trenches 102b are exposed.

Figure 2C:
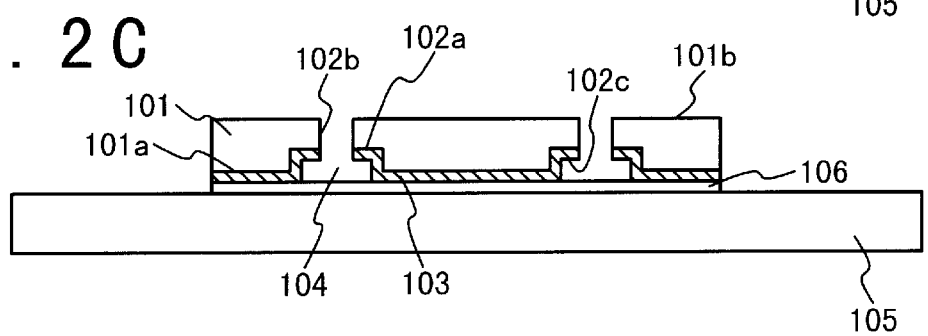

Next, as shown in FIG. 2C, the photoresist 104 exposed in the process of rendering the substrate 101 thin is washed away with an organic solvent. In this way, the surface 102c of the metal 103 in each first trench 102a and the second trench 102b are exposed.

Figure 2D:
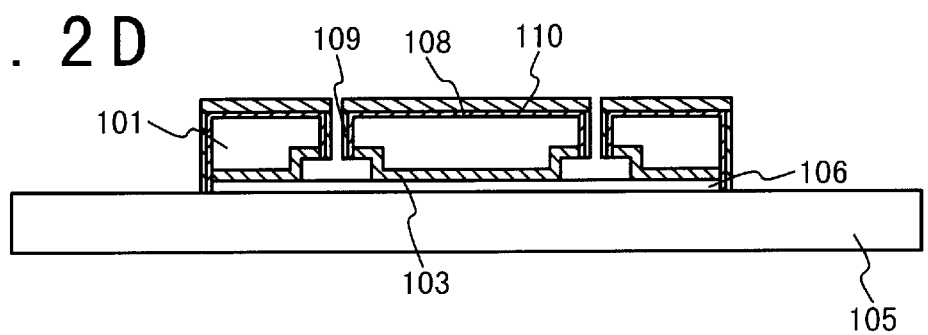

Next, as shown in FIG. 2D, a lower metal layer 108 is formed on the second main surface 101a of the substrate 101 to cover the second trenches 102b and the exposed surface 102c of the metal 103. The lower metal 108 is made of an electrically conductive metal such as Platinum (Pt) or gold (Au). The lower metal 108 is formed such that the lower metal 108 extends from the second main surface 101a of the substrate 101 to the exposed surface 102c of the metal 103.

The lower metal 108 can be formed by a film-forming method such as a sputtering method or a vapor deposition method. If the sputtering method is employed, the sputtered particles will easily move into the trenches 102a and 102b made in the first main surface 110a of the substrate 101. This facilitates the forming of the lower metal 108 that continuously extends from the lower metal 108 provided on the second main surface 101a of the substrate 101 to the exposed surface 102c of the metal layer 103.

Then, a gold film of 20 μm to 50 μm in thick is plated to reach the metal 103, by using the lower metal 108. The side wall metals 109 and a PHS or ground 110 as the upper metal layer are formed.

Figure 2E:
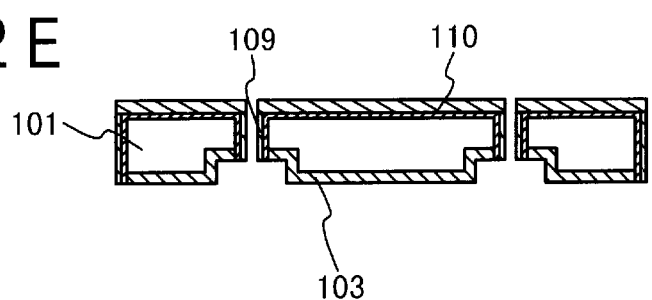

Finally, as shown in FIG. 2E, the wax 106 is solved, and the support 105 is removed. Thus, a chip, i.e., a semiconductor device is manufactured.

In the second embodiment, the metal 103 is formed after the first device-separating trenches 102a have been made. Alternatively, the metal film 103 may be formed after the second device-separating trenches 102b have been made.

If this alternative process is employed, the metal 103 is already formed on the side walls of each trench 102b when the lower metal 108 is formed. Therefore, it is possible to form a metal film that continuously extends from the second main surface 101a of the substrate 101 to the exposed surface 102c of the metal 103. Thus, the side wall metals 109 and the PHS 110 can be later formed in higher uniformity than otherwise.

In the first and second embodiments, the substrate 1 or 101 is processed and the device-separating trenches 2 or 102 are formed. Alternatively, projections may be formed on the first main surface of the substrate and the spaces between the projections may be used as device-separating trenches.

FIGS. 3A to 3F are cross-sectional views showing a semiconductor device in the manufacturing method employing this alternative method of making trenches in the third embodiment of the present invention. The third embodiment will be described with reference FIGS. 3A to 3F. In FIGS. 3A to 3F, the components identical or similar are designated at the same reference numerals. Once described in detail, each component will not be described again or will be described briefly.

Figure 3A:
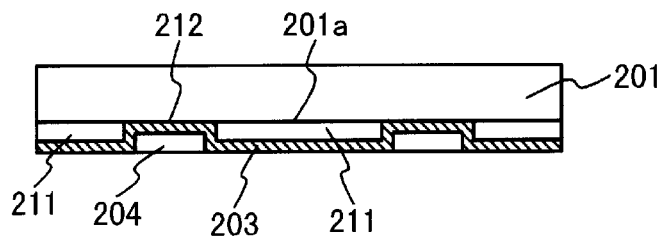
FIGS. 3A to 3F are cross-sectional views showing a method of manufacturing a semiconductor device, according to a third embodiment of the present invention.

As shown in FIG. 3A, a substrate 201 made of sapphire is prepared. Field effect transistors (not shown), transmission lines (not shown) and capacitors (not shown) are formed in the substrate 1. A thick gold is plated on a peripheral region surrounding the chip region (not shown) that is provided in the first main surface 201a of the substrate 201. The gold is processed to form a plurality of projections 211. The space between any two adjacent projections 211 is used as a first device-separating trench 212. The projections 211 are bout 20 μm to 50 μm in tall. The gap between any two adjacent projections 211 (i.e., the width of the trench 212) is about 100 μm to 400 μm. A metal 203 is formed on the region including the first device-separating trenches 212 by use of a known method such as a sputtering method or a vapor deposition method. The metal 203 is made of an electrically conductive metal such as platinum or gold and is used to supply the power in the metal plating process. Then, a photoresist 204 soluble to organic solvents is applied to fill the first device-separating trenches 212.

Figure 3B:
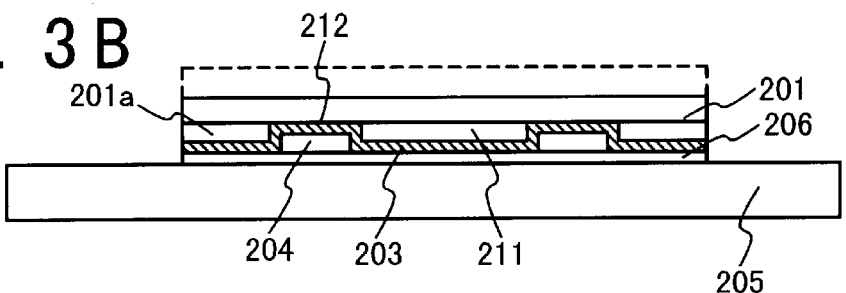

Next, as shown in FIG. 3B, the substrate 201 is bonded or fixed to a support 205 such as a quartz substrate, a sapphire substrate or an Si substrate at the first main surface 201a by use of wax 206. Subsequently, the substrate 201 is subjected to a mechanical polishing process to polish or grind the back surface or second main surface 201b of the substrate, until the substrate 201 becomes thin to the extent shown by the broken line in FIG. 3B.

Figure 3C:
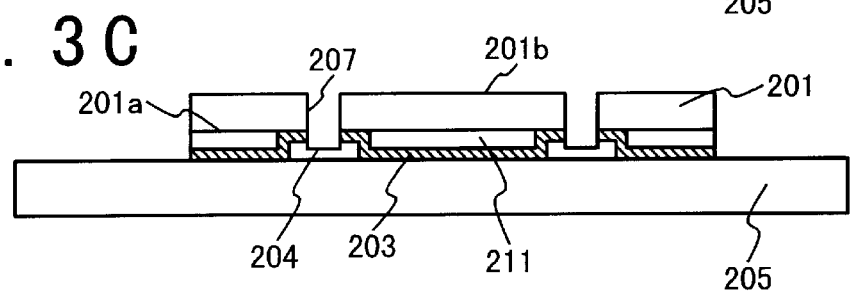

Next, as shown in FIG. 3C, second device-separating trenches 207 are formed in the second main surface 201b of the substrate 201 by use of a mechanical device such as a dicing saw. The second trenches 207 are at least so deep as to reach the first device-separating trenches 212. In the third embodiment, the second trenches 207 are just as deep, reaching the photoresist 204, as is shown in FIG. 3C.

Figure 3D:
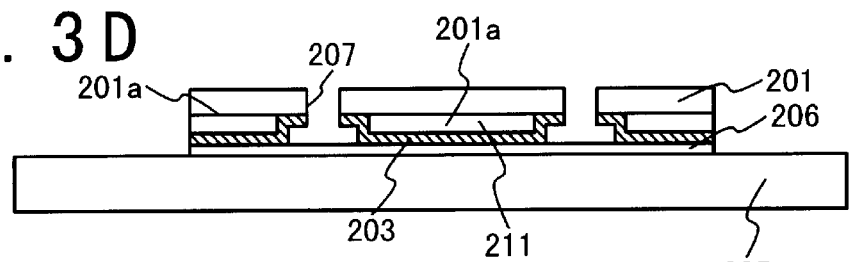

Next, as shown in FIG. 3D, those parts of the photoresist 204 exposed when the second trenches 207 are formed, are solved with an organic solvent and removed. The surfaces 212a of the first trenches 212 made of the metal 203 are exposed.

Figure 3E:
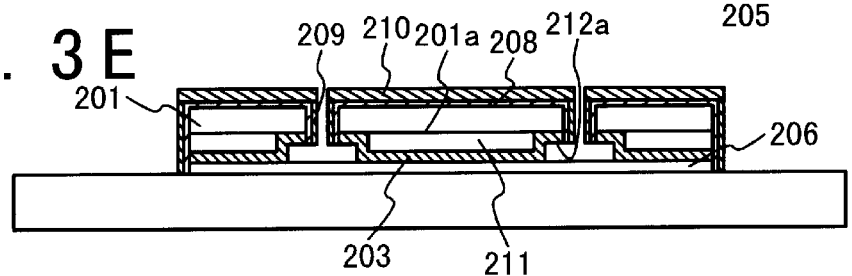

Next, as shown in FIG. 3E, a lower metal layer 208 is formed on the entire second main surface 201b including the second trenches 207 of the substrate 201 by a film-forming method. The lower metal 208 is made of an electrically conductive metal such as platinum or gold. The lower metal 208 covers the surfaces 212a of the first device-separating trenches 212 of the metal 203.

The lower metal 208 can be formed by a film-forming method such as a sputtering method or a vapor deposition method. If the sputtering method is employed, the sputtered particles will easily move into the second trenches 207 and to the exposed surface 212a of the metal 203. This facilitates the forming of a metal film that continuously extends from the second main surface 201b of the substrate 201 to the metal 203.

Subsequently, a gold having the thickness of 20 µm to 50 µm is plated as an upper metal to reach the metal 203, thereby forming side wall metals 209 and a PHS or ground layer 210.

Figure 3F:
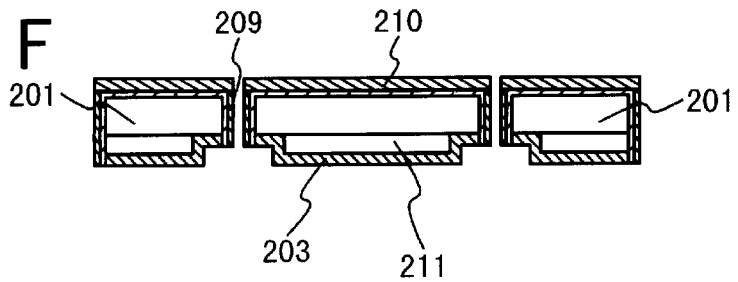

Finally, as shown in FIG. 3F, the wax 206 is solved, and the support 205 is removed. Thus, a chip, i.e., a semiconductor device is manufactured.

In the third embodiment, the metal 203 is formed after the projections 211 have been formed. Alternatively, the metal used to supply power in the plating process for forming the projections 211 can be used as the metal 203. The process of forming the metal 203 can be omitted to simplify the method of manufacturing a semiconductor device.

In the third embodiment, the projections 211 are provided on the first main surface 201a of the substrate 201, and the gap between any two adjacent projections 211 is used as a first device-separating trench 212. Further, the second device-separating trenches 207 are formed in the second main surface 201b of the substrate 201. Alternatively, the second device-separating trenches may be formed in the bottom of one first device-separating trench 212, i.e., a gap between two projections 211.

A method of manufacturing a semiconductor device, using this alternative method of making trenches according to the fourth embodiment of the present invention will be described with reference to FIGS. 4A to 4E. In FIGS. 4A to 4E, the components identical or similar are designated at the same reference numerals. Once described in detail, each component will not be described again or will be described briefly.

Figure 4A:
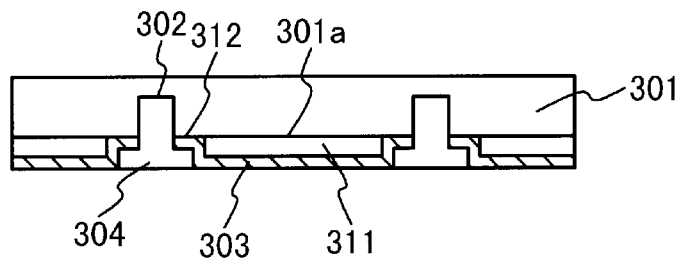
FIGS. 4A to 4E are cross-sectional views for explaining a method of manufacturing a semiconductor device, according to a fourth embodiment of the present invention.

As shown in FIG. 4A, a substrate 301 made of sapphire is prepared. Components such as field effect transistors (not shown), transmission lines (not shown), capacitors (not shown) and specific patterns are formed in the substrate 1. A thick gold is plated on a peripheral region surrounding the chip region (not shown) that is provided in the first main surface 301a of the substrate 301. The gold is processed to form a plurality of projections 311. The space between any two adjacent projections 311 is used as a first device-separating trench 312. The projections 311 are about 20 µm to 50 µm in tall. The gap between any two adjacent projections 311 (i.e., the width of the trench 312) is about 100 µm to 400 µm.

A metal 303 is formed on the region including the first device-separating trenches 312 by use of a known method such as a sputtering method or a vapor deposition method. The metal 303 is made of an electrically conductive metal such as platinum or gold, and used to supply the power in the metal plating process.

Then, second device-separating trenches 302 are made in the bottoms of first device-separating trenches 312. Thereafter, a photoresist 304 soluble to organic solvents is applied to fill the first device-separating trenches 312 and the second device-separating trenches 302.

Figure 4B:
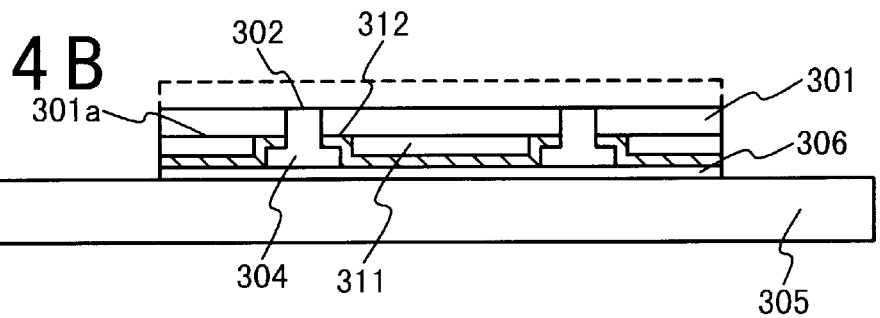

Next, as shown in FIG. 4B, the substrate 301 is bonded or fixed to a support 305 such as a quartz substrate, a sapphire substrate or an Si substrate at the first main surface 301a by use of wax 306. Subsequently, the substrate 301 is subjected to a mechanical polishing process to polish or grind the back surface or second main surface of the substrate 301, until the substrate 301 becomes thin to the extent shown by the broken line in FIG. 4B.

Figure 4C:
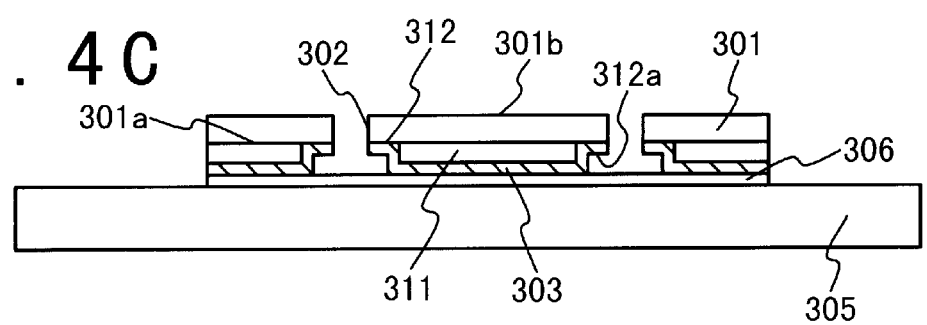

Next, as shown in FIG. 4C, those parts of the photoresist 304 exposed when the substrate 301 is made thinner is solved with an organic solvent and removed. The surfaces 312a of the first trenches 312 formed of the metal 303 are exposed.

Figure 4D:
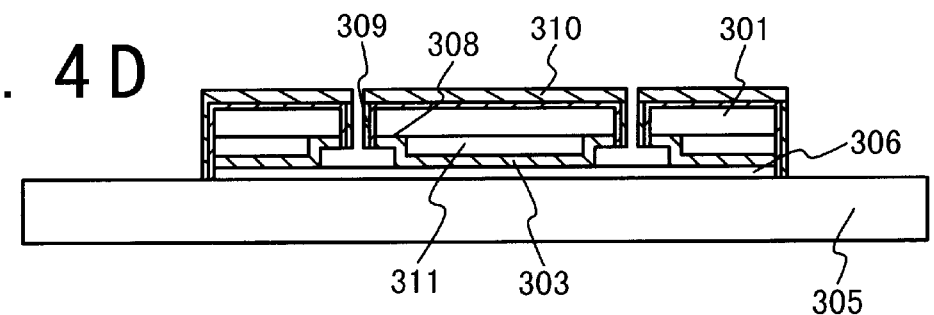

Next, as shown in FIG. 4D, a lower metal layer 308 is formed on the entire second main surface 301b of the substrate 301 by a film-forming method. The lower metal 308 is formed of an electrically conductive metal such as platinum or gold. The lower metal 308 is continuous to extend from the second main surface 301b of the substrate 301 to the metal 303. The lower metal 308 can be formed by a film-forming method such as a sputtering method or a vapor deposition method. If the sputtering operation is employed, the sputtered particles will easily move into the second trenches 302 and to the exposed surface 212a of the metal 303. This facilitates the forming of a metal film that continuously extends from the lower metal 308 on the second main surface 301b of the substrate 301 to the metal 303.

Next, as shown in FIG. 4D, a gold having the thickness of 20 µm to 50 µm as an upper metal is plated on the second main surface 301b and side walls of the substrate 301 to reach the metal layer 303. Thus, side wall metals 309 and a PHS layer or grounds 310 are formed.

Figure 4E:
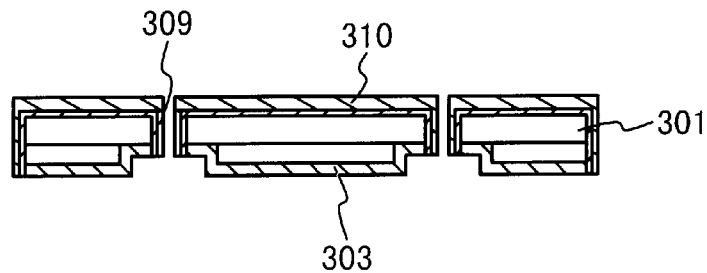

Finally, as shown in FIG. 4E, the wax 306 is solved, and the support 305 is removed. Thus, a chip, i.e., a semiconductor device is manufactured.

In the fourth embodiment, the metal used to supply power in the plating process for forming the projections 311 can be used as the metal layer 303 in the same way as in the third embodiment. The process of forming the metal 303 can be omitted to simplify the method of manufacturing a semiconductor device.

In this embodiment, the metal 303 is formed after the projections 311 have been formed. Alternatively, the metal 303 may be formed after he second trenches 302 have been made in the first trenches 312. If this is the case, the metal 303 is already provided on the surfaces of the second trenches 302 before the lower metal 308 is formed. A metal extending from the second main surface 301b of the substrate 301 to the exposed surface 212a of the metal 303 can thus be formed on the second main surface 301b of the substrate 301. This enhances the uniformity of the plating that will be performed 1a later.

In the third and fourth embodiments, the gaps between the projections 211 or 311 are used as the first device-separating trenches 212 or 312. Hence, the metal 203 or 303, which is provided in the first device-separating trenches 212 or 312, contacts the surface of the substrate 201 or 301. Therefore, the metal 203 or 303 has a better surface condition than in the first and second embodiments in which the device-separating trenches 2 or 102 are made by a mechanical process. It follows that the formed by a plating process on the metal 203 or 303 has higher uniformity than in the first and second embodiments.

As has been described in detail, trenches are made in, or projections are provided on, the first main surface of a substrate having a semiconductor layer, in the method of manufacturing a semiconductor device according to the present invention. Thus, when the substrate is bonded to the support at the first main surface, and a gap is provided between the support and the metal formed in each trench.

When the second trenches are made in the second main surface of the substrate and the lower metal is formed on the second main surface by a film-forming method such as sputtering, the lower metal is deposited on the side walls and exposed surface of the metal. A uniform can therefore be plated and can serve as side walls and a PHS or ground.

A metal can be formed directly on that surface of the substrate which is not mechanically processed, particularly in the method in which projections are formed on the main surface of the substrate and a gap between any two adjacent projections is used as a device-separating trench. The metal therefore has a good surface condition. The plated on the metal has higher uniformity than in the case where the metal has not good surface condition.

In the method in which projections are formed on the main surface of the substrate, the metal used for supplying power to form the projections by plating can be used. The process of forming the metal layer can be omitted. This simplifies the method of manufacturing a semiconductor device.

What is claimed is:

1. A method of manufacturing a semiconductor device comprising the steps of:

(a) forming trench sections on a side of one of opposing surface portions of a substrate, wherein at least part of each of said trench sections is covered by a power supply metal which is formed on said one surface portion of said substrate;

(b) fixing said substrate to a support such that said one surface of said substrate fits to said support;

(c) separating a chip from said substrate using said trench sections;

(d) forming a conductive film on side surface portions of said chip and the other surface portion of said chip; and (e) separating said chip from said support.

2. The method according to claim 1, wherein said (a) forming step comprises the step of:

cutting said surface portion of said substrate to form said trench sections.

3. The method according to claim 2, wherein said (c) separating step comprises the step of:

cutting said substrate from the other surface portion of said substrate to said trench section.

4. The method according to claim 2, wherein said (c) separating step comprises the steps of:

grinding the other surface portion of said substrate; and cutting said grinded substrate from the other surface portion to said trench section.

5. The method according to claim 1, wherein said (a) forming step comprises the step of:

cutting said one surface portion of said substrate to form first trench portions;

forming said power supply metal to cover said one surface portion of said substrate and a surface of each of said first trench portions; and cutting said first trench portions to form second trench sections so that said trench sections are formed.

6. The method according to claim 5, wherein said (c) separating step comprises the step of:

grinding the other surface portion of said substrate such that said second trench portions are exposed.

7. The method according to claim 1, wherein said (a) forming step comprises the step of:

forming a peripheral film in a peripheral portion of said chip on said one surface portion of said substrate to form said trench sections.

8. The method according to claim 7, wherein said (c) separating step comprises the step of:

cutting said substrate from the other surface portion of said substrate to said trench sections.

9. The method according to claim 7, wherein said (c) separating step comprises the steps of:

grinding the other surface portion of said substrate; and cutting said grinded substrate from the other surface portion of said substrate to said trench section.

10. The method according to claim 1, wherein said (a) forming step comprises the step of:

forming a peripheral film in a peripheral portion of said chip on said one surface portion of said substrate to form first trench portions;

forming said power supply metal to cover said one surface portion of said substrate and a surface of each of said first trench portions; and cutting said first trench portions to form second trench sections so that said trench sections are formed.

11. The method according to claim 10, wherein said (c) separating step comprises the step of:

grinding the other surface portion of said substrate such that said second trench portions are exposed.

12. The method according to claim 1, wherein said (b) fixing step further comprises the step of:

filling a material soluble to a solvent in said trench section.

13. The method according to claim 1, wherein said conductive film includes a first conductive film and a second conductive film, and said (d) forming step comprises the steps of:

(f) forming said first conductive film on side surface portions of said chip and the other surface portion of said chip; and (g) forming said second conductive film on said first conductive film.

14. The method according to claim 13, wherein said first conductive film is formed by a sputtering method or a vapor deposition method.

15. The method according to claim 13, wherein said second conductive film is formed by a plating method.

\* \* \* \* \*

UNITED STATES PATENT AND TRADEMARK OFFICE
CERTIFICATE OF CORRECTION

PATENT NO. : 6,440,822 B1 Page 1 of 1
DATED : August 27, 2002
INVENTOR(S) : Hayama It is certified that error appears in the above-identified patent and that said Letters Patent is hereby corrected as shown below:

Column 5,
Line 36, "110a" should be --101a --
Line 56, "110a" should be --101a --.

Column 10,
Line 2, "metal which" should be -- metal layer which --.
Line 64, "metal to cover" should be -- metal layer to cover --.

Signed and Sealed this

Eighth Day of June, 2004

JON W. DUDAS
*Acting Director of the United States Patent and Trademark Office*